United States Patent [19]
Cho

[11] Patent Number: 5,926,376
[45] Date of Patent: Jul. 20, 1999

[54] PRINTED CIRCUIT BOARD CARD FOR MOUNTING PACKAGES IN FACES THEREOF

[75] Inventor: Yong Jin Cho, Kyungsangnam-do, Rep. of Korea

[73] Assignee: LG Semicon Co., Ltd., Chungcheongbuk-Do, Rep. of Korea

[21] Appl. No.: 08/878,599

[22] Filed: Jun. 19, 1997

[30] Foreign Application Priority Data

Jun. 19, 1996 [KR] Rep. of Korea ................... 96-22280

[51] Int. Cl.⁶ ................................................. H05K 1/18
[52] U.S. Cl. ........................ 361/761; 361/719; 361/762; 361/764; 361/774; 257/686; 257/723
[58] Field of Search ................... 361/719, 748, 361/761, 762, 764, 790, 774; 257/723, 724, 692, 693, 686

[56] References Cited

U.S. PATENT DOCUMENTS

| | | | |
|---|---|---|---|
| 3,942,245 | 3/1976 | Jackson et al. | 29/827 |
| 4,143,508 | 3/1979 | Ohno | 361/764 |
| 4,413,308 | 11/1983 | Brown | 361/764 |
| 4,682,270 | 7/1987 | Whitehead et al. | 361/764 |
| 4,744,008 | 5/1988 | Black et al. | 361/762 |
| 4,964,019 | 10/1990 | Belanger, Jr. | 361/764 |
| 4,994,938 | 2/1991 | Baudouin | 361/761 |
| 5,241,456 | 8/1993 | Marcinkiewicz et al. | 361/761 |
| 5,280,192 | 1/1994 | Kryzaniwsky | 257/723 |
| 5,373,189 | 12/1994 | Massit et al. | 257/723 |
| 5,450,289 | 9/1995 | Kweon et al. | 361/773 |
| 5,606,198 | 2/1997 | Ono et al. | 361/769 |
| 5,615,087 | 3/1997 | Wieloch | 361/719 |
| 5,714,800 | 2/1998 | Thompson | 257/692 |
| 5,731,633 | 3/1998 | Clayton | 257/723 |
| 5,763,947 | 6/1998 | Bartley | 257/693 |

FOREIGN PATENT DOCUMENTS

4-127461 4/1992 Japan ........................ 257/724

*Primary Examiner*—Leo P. Picard
*Assistant Examiner*—John B. Vigushin

[57] ABSTRACT

A Printed Circuit Board (PCB) card for insertion in a computer expansion slot and a method of making such a PCB card are disclosed. The PCB card includes packages disposed at least partially between a top face portion and a bottom face portion of the PCB, which improves the mounting density and heat dissipation for the packages.

14 Claims, 7 Drawing Sheets

PRINTED CIRCUIT BOARD CARD FOR MOUNTING PACKAGES IN FACES THEREOF

BACKGROUND OF THE INVENTION

1. Field of the Invention

The present invention relates to a Printed Circuit Board (PCB) card with packages mounted thereon and, more particularly, to a package mounting type PCB card for insertion in a computer expansion slot.

2. Discussion of the Related Art

Figure 1:
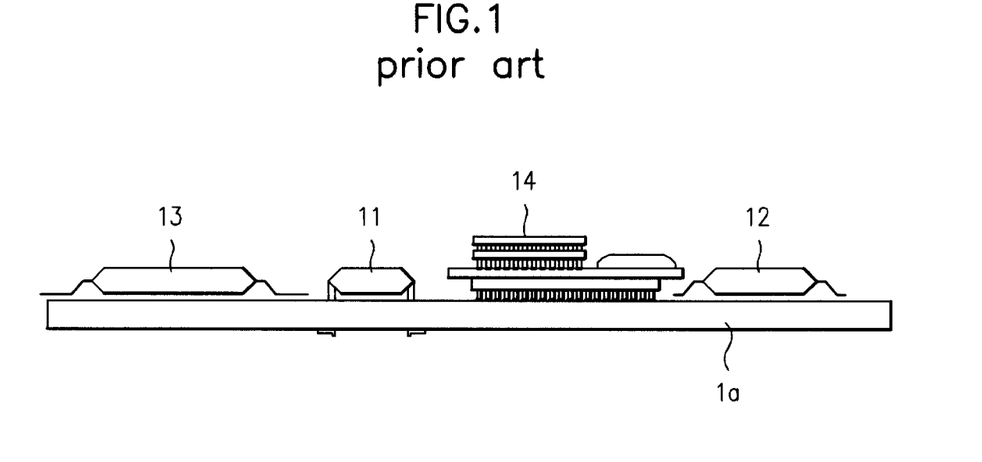
FIG. 1 is a front view of a conventional PCB card showing different type packages mounted thereon.

Referring to FIG. 1, a conventional PCB card includes different type packages, such as, for example, a Dual-In-Line Package (DIP) 11, a Quad-Fold Package (QFP) 12, a Multi-Chip Module (MCM) 13, and a piggy-back type package 14, mounted on a PCB 1a. Such type packages mounted on the PCB 1a increases the thickness (i.e., the amount of space the PCB 1a and packages mounted thereon occupy from the base of the PCB 1a to a top plane of the packages) of the conventional PCB card. Particularly, the piggy-back type package 14 causes the conventional PCB card to have a large thickness compared to the other type packages. As a result of having such type packages, e.g., the piggy-back type package, mounted on the conventional PCB card, the thickness of the conventional PCB card increases thereby hampering conventional PCB cards from being thinner and from preventing heat dissipation.

Thus, conventional PCB cards, which are inserted in expansion slots of a computer that are fixed distances apart, have interference problems because of the thickness of the PCB cards. As a result, conventional PCB cards have been inserted, not in every slot, but in every other slot to prevent interference between the packages of conventional PCB cards. When space for mounting the PCB cards is limited, problems arise that the circuits on the PCB 1a, as well as the packages, suffer from thermal and electrical interference between packages and circuits of adjacent PCB cards. Because of thermal and electrical interference, circuits and packages are damaged. The various type packages mounted on the conventional PCB 1a decrease spatial efficiency and mounting density. Moreover, heat dissipation deficiency also causes damage to packages and circuits of conventional PCB cards.

SUMMARY OF THE INVENTION

Accordingly, the present invention is directed to a printed circuit board card having packages mounted thereon that substantially obviates one or more of the problems due to limitations and disadvantages of the related art.

An object of the present invention is to provide a printed circuit board (PCB) card having at least one wireless, super-slim type package mounted thereon and a method of making such a PCB card.

To achieve these and other advantages and in accordance with the purpose of the present invention, as embodied and broadly described, there is provided the printed circuit board card having at least one package mounted thereon and a method for so making. Such a PCB card includes: a printed circuit board having a first face portion and a second face portion; and at least one package, each package being mounted to the PCB so that at least a portion of the package is located between the first face portion and the second face portion of the printed circuit board.

In another aspect of the present invention, there is provided a printed circuit board card having packages mounted thereon, and a method of so making the PCB card including: a printed circuit board defining at least one recess region, each recess region being disposed in one of a first face portion and a second face portion of said printed circuit board; and at least one package, each package mounted in each recess region.

In another aspect of the present invention, there is provided a printed circuit board card device comprising: a plurality of printed circuit boards, each printed circuit board defining a plurality of recess regions; and a plurality of packages, each package formed in one of the plurality of recess regions.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

In the drawings:

FIGS. 5a and 5b illustrate the structural details of the area in the circle labeled "B" in FIG. 2; wherein.

FIGS. 6a and 6b illustrate embodiments of the present invention; wherein,

FIGS. 7a and 7b illustrate further embodiments of the present invention; wherein.

DETAILED DESCRIPTION OF THE PREFERRED EMBODIMENTS

Reference will now be made in detail to the preferred embodiments of the present invention, examples of which are illustrated in the accompanying drawings.

Figure 2:
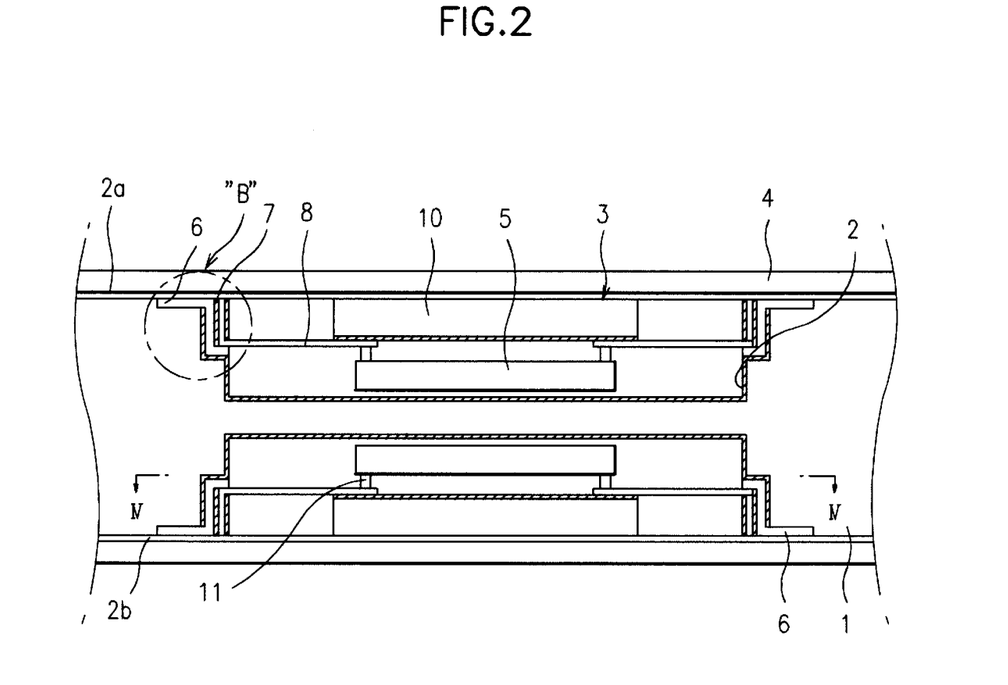
FIG. 2 is a longitudinal cross sectional view of a PCB card having a wireless, super-slim type package mounted thereon in accordance with a first embodiment of the present invention.
Figure 3:
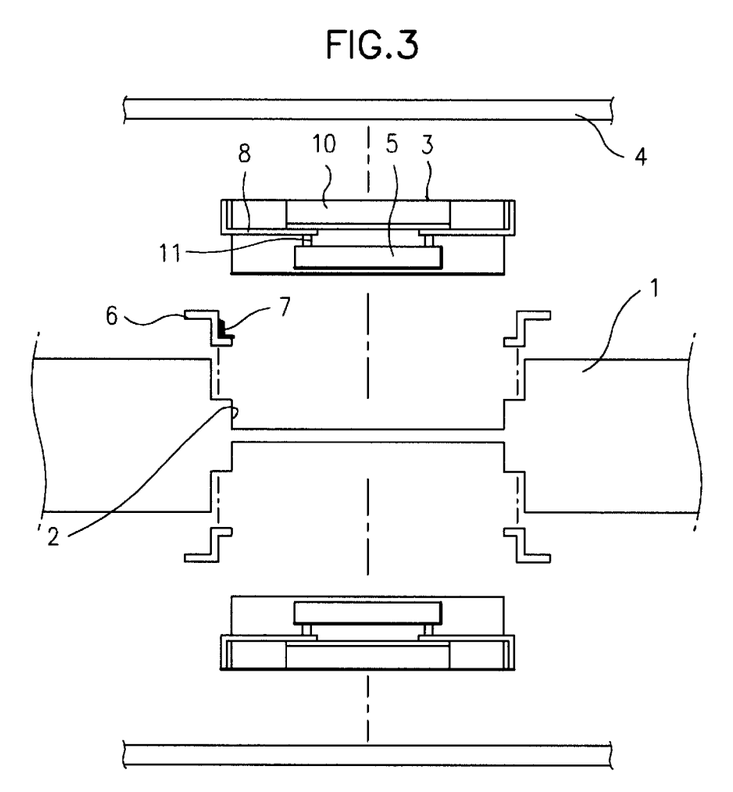
FIG. 3 is a disassembled view of the components of the PCB card shown in FIG. 2 to illustrate the mounting sequence of the components of FIG. 2.
Figure 4:
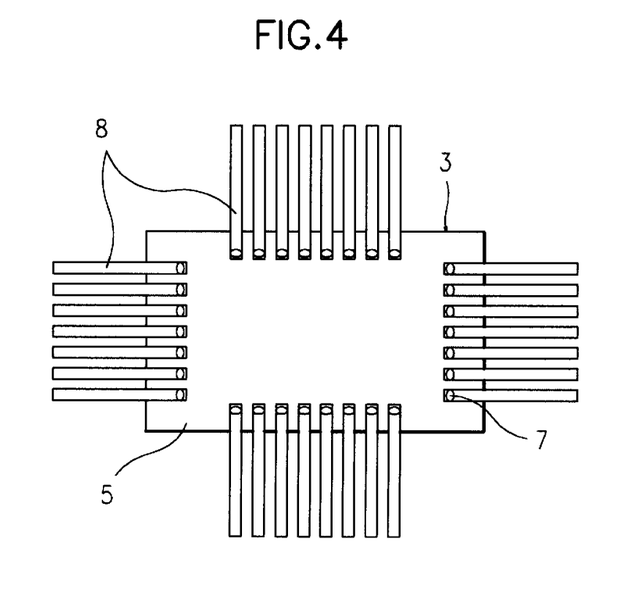
FIG. 4 is a cross sectional view taken along the line IV—IV as shown in FIG. 2.
Figure 5A:
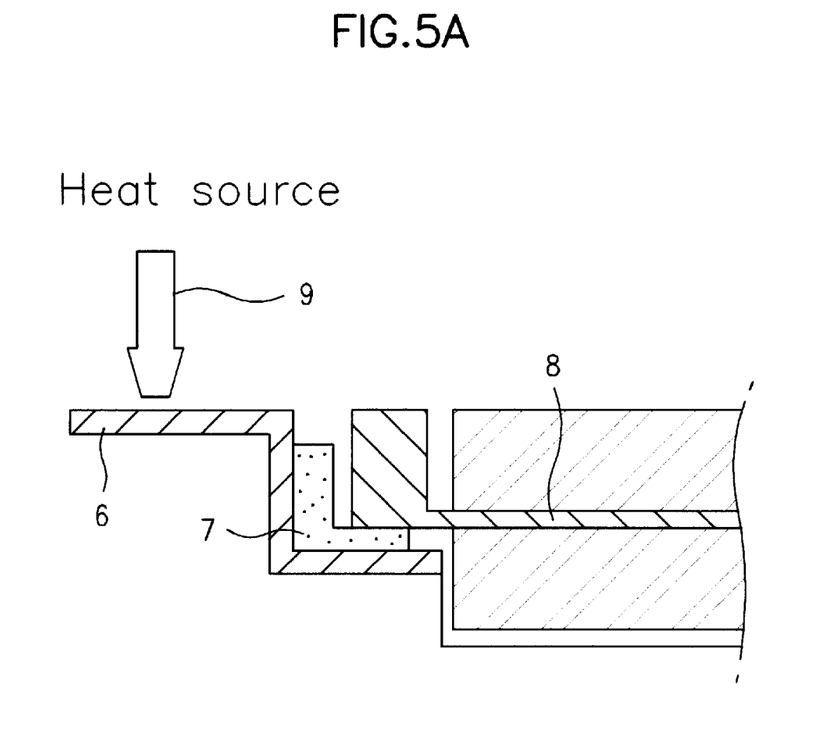
FIG. 5a shows a state before solder an inner lead of the PCB and a contact lead of the wireless, super-slim type package of the present invention together.
Figure 5B:
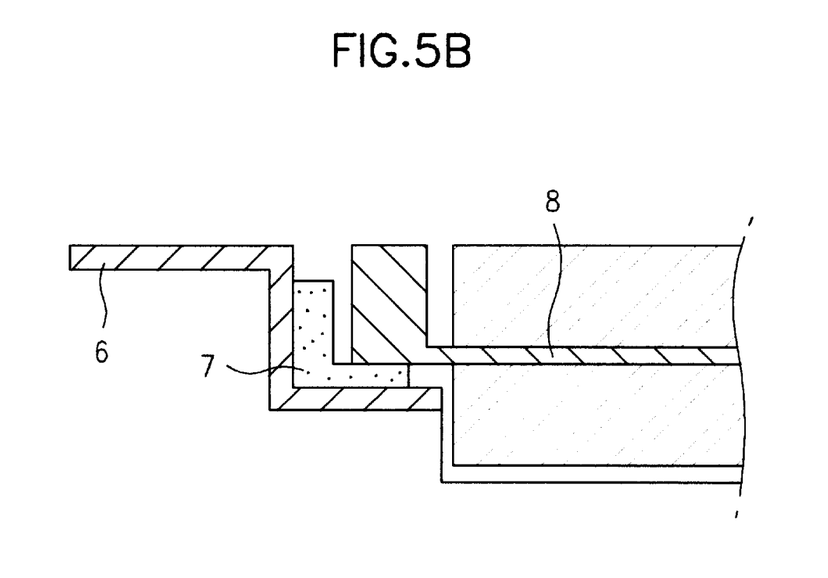
FIG. 5b shows a state after solder the inner lead of the PCB and the contact lead of the wireless, super-slim type package of the present invention together.

FIG. 2 is a longitudinal cross sectional view of a PCB card having wireless, super-slim type packages mounted thereon in accordance with a first embodiment of the present invention. FIG. 3 is a disassembled view of the components of the PCB card shown in FIG. 2 to illustrate the mounting sequence of the components of FIG. 2. FIG. 4 is a cross sectional view taken along the line IV—IV, as shown in FIG. 2, and FIGS. 5a and 5b illustrate structural details of the area in the circle labelled "B" as shown in FIG. 2.

A printed circuit board card having packages mounted thereon in accordance with a first embodiment of the present invention will be explained with reference to FIGS. 2–4 and 5a–5b.

Referring to FIG. 2, the printed circuit board card having packages mounted thereon in accordance with a first embodiment of the present invention includes a printed circuit board PCB 1 having a plurality of recess regions (i.e., cavities) 2 formed in a top face 2a portion and a bottom face 2b portion thereof, and a plurality of wireless, super-slim type packages (hereinafter "wireless-slim type packages") 3 disposed in the recess regions 2, respectively. The wireless-slim type packages use bumpers 11 to form an electrical connection between contact leads 8 and pads on a chip 5. Preferably, the bumpers are made of gold and are shaped like balls thereby avoiding the use of wires to form an electrical connection between contact leads 8 and the chip 5 and reducing the amount of space between the connection.

The wireless-slim type packages 3 connect to the PCB 1 by the inner leads 6 on the rim of the recess regions 2 defined by a top face 2a portion and bottom face 2b portion of the PCB 1. The wireless-slim type packages 3 each include a chip 5 having electrical circuits contained therein, a heat spreader/sink 10 for dissipating heat away from the chip 5, contact leads 8, bumpers 11 for connecting the contact leads 8 to the chip 5, and solder portions 7 for connecting the contact leads 8 with the inner leads 6 of the PCB 1 to form an electrical connection between the PCB 1 and each wireless-slim type package. The heat spreader 10 and the contact leads 8 are bonded together by an electrically insulating, but thermally conducting, bonding tape (not shown) on the bottom surface of the heat spreader 10. Also, an insulating member 4 is attached on the top face 2a portion and bottom face 2b portion of the PCB 1 for preventing the wireless-slim type packages 3 from being damaged and oxidized.

Referring to FIG. 3, which illustrates the steps for mounting the wireless-slim type packages 3, recess regions 2 are formed in the top face 2a portion and bottom face 2b portion of the PCB 1. Inner leads 6 of the PCB 1 are attached on the rim of the recess regions 2 defined by the top face 2a portion and bottom face 2b portion of the PCB 1, respectively. The inner leads 6 of the PCB 1 serve as terminals to electrically connect with the wireless-slim type packages 3 by the contact leads 8. Solder portions 7, which can be melted/ solidified instantly depending on the temperature applied, are coated on an outside surface of the inner leads 6.

After mounting the wireless-slim type packages 3 in the recess regions 2 of top face 2a portion and bottom face 2b portion of the PCB 1, respectively, the solder portions 7 are soldered to the inner leads 6 of the PCB 1a and the contact leads 8 of the wireless-slim type packages 3 to form an electrical connection. Then, the insulating members 4, which have an excellent thermal conductivity and electrical insulation property, are coated on the top face 2a portion and bottom face 2b portion, which covers the wireless-slim type packages 3, of the PCB 1.

The insulating members 4 protect the mounted wireless-slim type packages 3 from external impact and transfer heat away from the wireless-slim type packages 3. The heat generated from the wireless-slim type packages 3 are caused from heat generated by the chip 5 which quickly dissipates its heat into the heat spreader 10. The heat spreader 10, which has an excellent thermal conductivity, quickly discharges heat outside of the chip 5.

FIG. 3 depicts the wireless-slim type packages 2 as not extending beyond the top face 2a portion of the PCB 1. Alternatively, the wireless-slim type packages 3 assembly could extend beyond the top face 2a portion. The same applies to the bottom face 2b portion.

Referring to FIG. 4, which illustrates the cross sectional view taken along the line IV—IV in FIG. 2, the contact leads 8 are partially disposed on the heat spreader 10 of the wireless-slim type packages 3 in contact with the bumpers 11. The bumpers 11 are in contact with chip pads (not shown) on the chip 5. Thus, FIG. 4 illustrates how contact leads connect with the chip 5 by the use of the bumpers 11.

A further alternative to the exemplary embodiment of FIG. 3 is to form an aperture in the PCB rather than a recess. Like FIG. 4, the wireless-slim type packages could lie between the faces of the PCB, or a portion of the wireless-slim type packages could extend beyond the top and/or bottom face portions 2a and 2b, respectively.

Referring to FIGS. 5a and 5b, the process of connecting the solder portions 7 with the PCB 1 inner leads 6 attached on the rim of the recess regions 2 defined by the top face 2a portion and bottom face 2b portion of the PCB 1 and contact leads 8 of the wireless-slim type packages 3 is illustrated. FIGS. 5a–5b illustrate a process for connecting a single contact lead 8, solder portion 7, and inner lead 6, however, the process is not limited to a single connection and can be used to form a plurality of connections. First, the wireless-slim package 3 is inserted into the recess region where contact lead 8 is placed on the solder portion 7 that is between the inner lead 6 and contact lead 8. Then, the solder portion 7 is heated by a heat source 9, e.g., electric, for solder whereby the solder portion 7 melts instantly. Preferably, the temperature for solder is approximately 230° C. Second, after the solder portion 7 melts, the melted solder portion 7 bonds with the inner lead 6 and the contact lead 8 of the wireless-slim type package 3 to form an electrical connection. The force on the melted solder is not sufficient to cause the melted solder to flow from between the inner lead 6 and the contact lead 8 because of the surface tension between the melted solder portion 7, the inner lead 6, and between the melted solder portion 7 and contact lead 8.

Figure 6A:
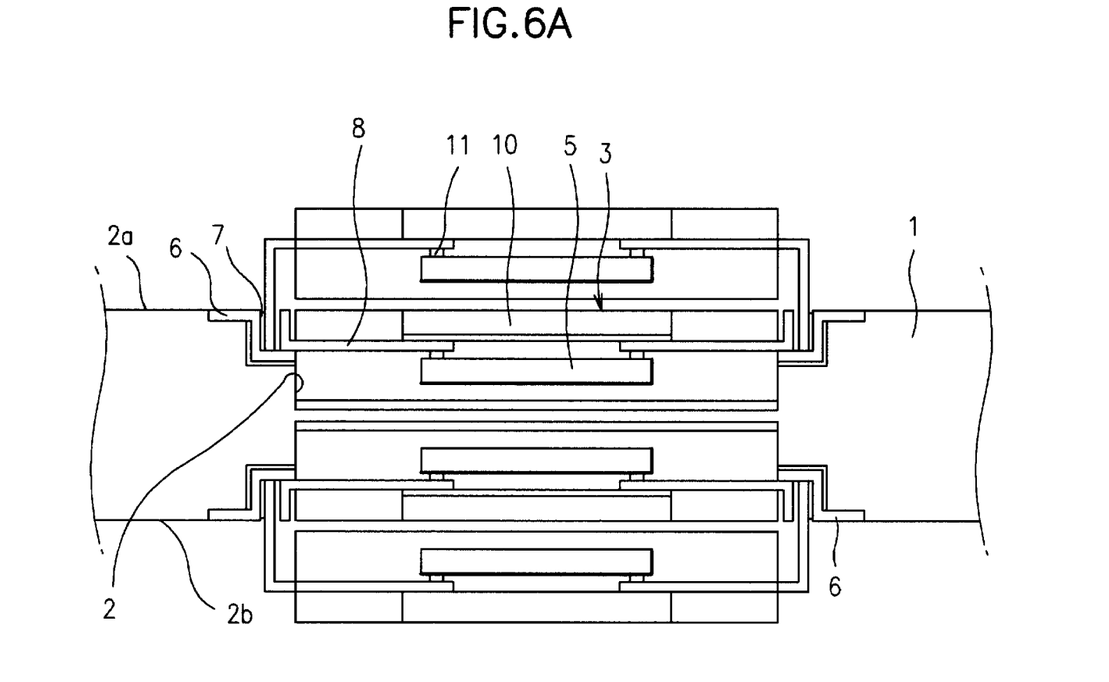
FIGS. 6a and 6b are longitudinal cross sectional views of the PCB card having a plurality of wireless, super-slim type packages mounted on the PCB board of the present invention.
Figure 6B:
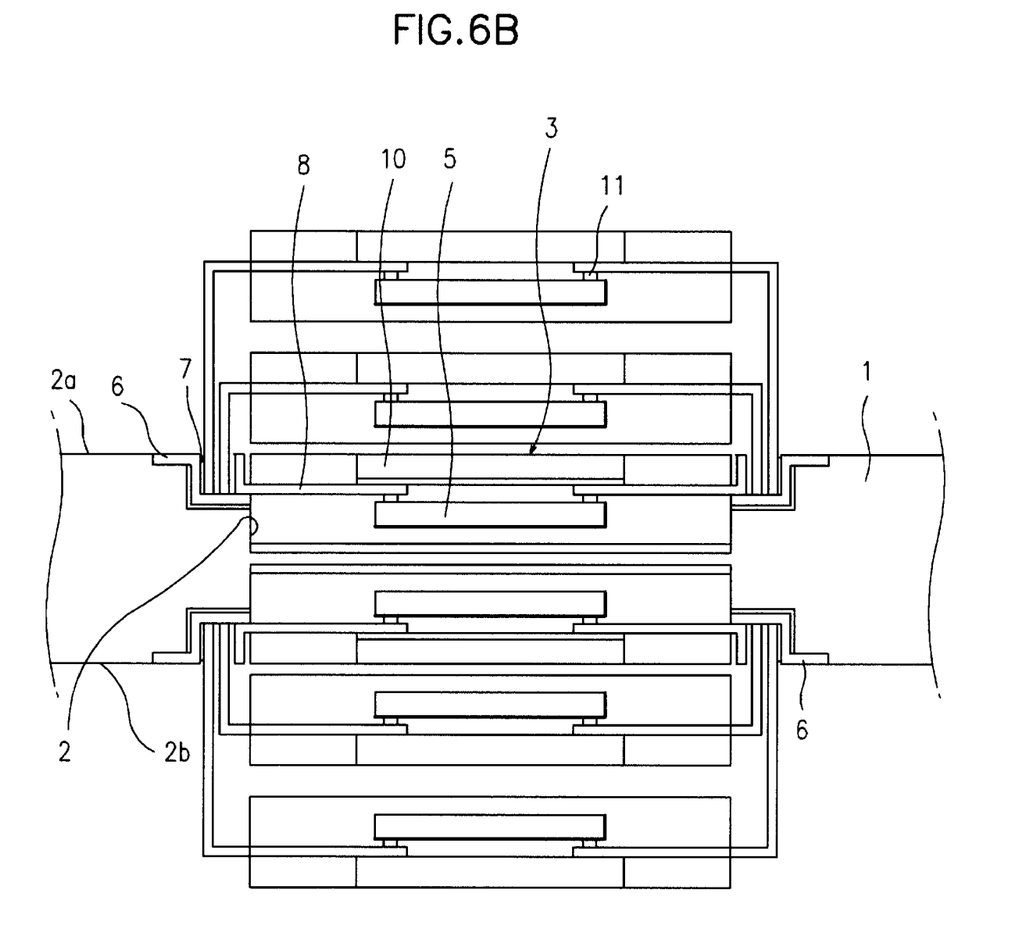

As shown in FIGS. 6a and 6b, a number of wireless-slim type packages 3 can be stacked together in the recess regions 2 in the top face 1a portion and bottom face 1a portion of the PCB 1. This is accomplished by having solder portions 7 of each package 3 connecting to PCB inner leads 6, and each package contact leads 8 connecting to the solder portions 7. As a result, each stacked wireless-slim type package 3 is electrically connected to the PCB 1.

Figure 7A:
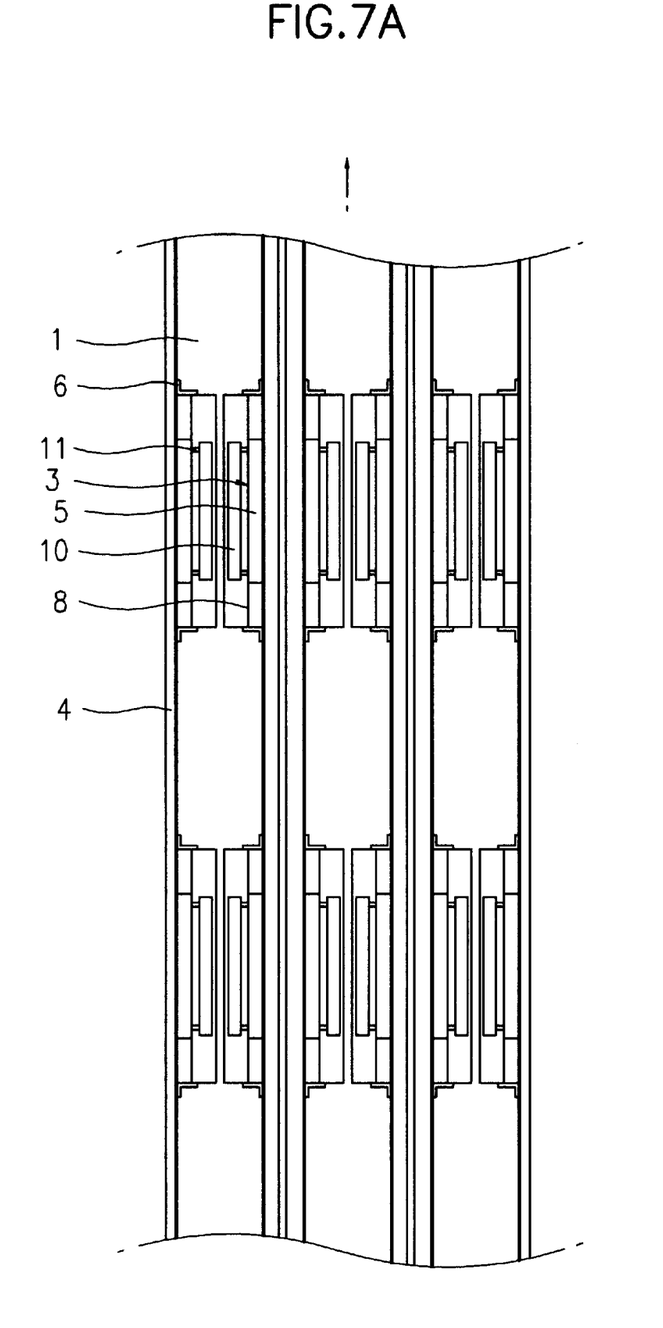
FIG. 7a illustrates a longitudinal sectional view of PCB cards of the present invention stacked in a standard manner; and, FIG. 7b illustrates a longitudinal section view of the PCB cards of the present invention stacked in a thermal interference prevention manner which can prevent thermal interferences between the packages.
Figure 7B:
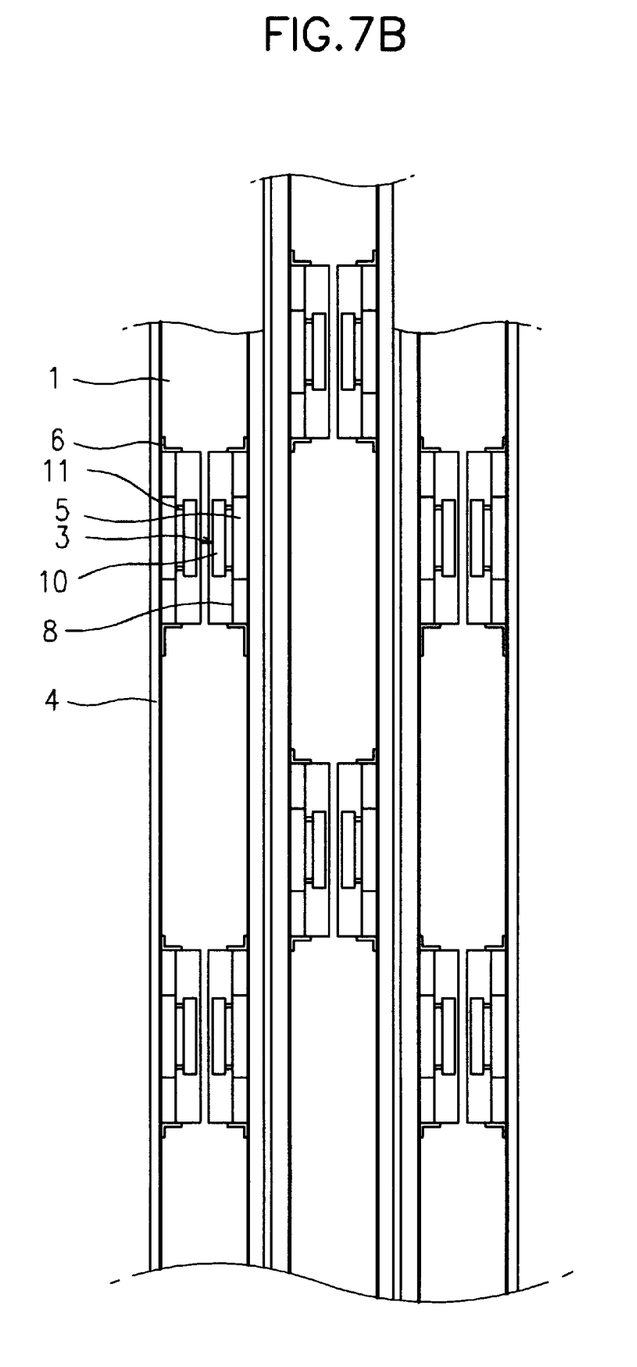

FIGS. 7a and 7b illustrate further embodiments of the present invention. FIG. 7a is a longitudinal sectional view of the PCB cards of the present invention stacked in a standard manner and FIG. 7b is a longitudinal sectional view of PCB cards of the present invention stacked in a thermal interference prevention manner. FIG. 7a shows stacked PCB cards of the present invention having wireless-slim type packages 3 mounted thereon. The mounted wireless-slim type packages 3 are in the same area in adjacent PCB cards (i.e., being on a same line) and FIG. 7b shows the packages 3 mounted in the PCB cards of the present invention stacked in a zigzag formation to improve heat dissipation from the packages because the packages are not aligned.

The wireless-slim package mounting type PC card of the present invention has the following advantages.

First, because the PCB cards of the present invention are thinner (i.e., use less space) compared to conventional PCB cards, the PCB cards of the present invention can improve mounting density and spatial efficiency.

Second, especially where the mounted packages do not extend beyond the faces of the PCB, the PCB cards of the present invention can effectively protect the mounted packages from external impacts.

Third, the PCB cards of the present invention are excellent in preventing heat dissipation, which can prevent electrical damage to the wireless-slim type packages 3 as well as the PCB 1. As a result, reliability of the PCB card can be improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A printed circuit board card comprising:

a printed circuit board (PCB) having at least one recess region therein, each recess region being disposed in one of a first face and a second face of said PCB;

at least one package, each package being mounted in a recess region so that at least a portion of the package lies below said first face or said second face of said PCB, respectively;

connection leads, disposed on at least a surface of said first face or said second face of said PCB and extending into said at least one recess region disposed therein, that electrically connect said PCB to said at least one package, respectively; and a first insulator formed on said at least one package and one of said first face and second face of said PCB, said first insulator preventing oxidation and damage to each package.

2. A printed circuit board card comprising:

a printed circuit board (PCB) having at least one recess region therein, each recess region being disposed in one of a first face and a second face of said PCB;

a plurality of stacked packages, at least a bottom-most one of said stacked packages being mounted in a recess region so that at least a portion of the package lies below said first face or said second face of said PCB, respectively; and connection leads, disposed on at least a surface of said first face or said second face of said PCB and extending into said at least one recess region disposed therein, for electrically connecting said PCB to each of said stacked packages, respectively.

3. The printed circuit board card of claim 2, wherein said at least one package is entirely located in said recess regions.

4. The printed circuit board card of claim 2, wherein the PCB has at least one recess region formed in said first face and at least one recess region formed in said second face and a corresponding number of packages mounted therein, respectively.

5. The printed circuit board card of claim 4, wherein said at least one recess region formed in said first face is aligned with said at least one recess region in said second face.

6. A printed circuit board card of claim 2, wherein said at least one package is entirely located between said first face and said second face of the PCB.

7. The printed circuit board card of claim 2, wherein each package is a wireless package.

8. The printed circuit board card of claim 2, wherein the connection leads have a step shape.

9. The printed circuit board card of claim 2, wherein each package includes:

at least one chip, each chip having electrical circuits contained therein;

electrical terminals for connecting said at least one chip to said connection leads of said PCB; and a heat spreader for dissipating heat away from said at least one chip.

10. The printed circuit board card of claim 9, further comprising:

solder portions disposed between the connection leads and electrical terminals of each package for connecting the connection leads of said PCB to the electrical terminals of each package.

11. The printed circuit board card device of claim 10, wherein at least one stacked package is mounted in a recess region so that at least a portion of the stacked package lies below said first or second face, respectively.

12. The printed circuit board card of claim 9, wherein the electrical terminals include:

a bumper for connecting a pad of a chip with the connection leads of the PCB.

13. A printed circuit board card device comprising:

a plurality of printed circuit boards stacked onto one another, each printed circuit board defining a plurality of recess regions;

a plurality of packages, each package formed in one of said plurality of recess regions;

wherein each package mounted in one of said plurality of recess regions is oriented in a zig-zag fashion with each package mounted in an adjoining recess region of an adjoining printed circuit board so that packages on opposing PCBs do not align.

14. The printed circuit board card device of claim 13, wherein each printed circuit board has a common adjoining face.

* * * * *